United States Patent
Lee et al.

(10) Patent No.: US 9,281,263 B2
(45) Date of Patent: Mar. 8, 2016

(54) INTERCONNECT STRUCTURE INCLUDING A CONTINUOUS CONDUCTIVE BODY

(71) Applicant: Taiwan Semiconductor Manufacturing Co., Ltd., Hsin-Chu (TW)

(72) Inventors: Ming Han Lee, Taipei (TW); Hai-Ching Chen, Hsinchu (TW); Hsiang-Huan Lee, Jhodong Township (TW); Tien-I Bao, Dayuan Township (TW); Chi-Lin Teng, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/258,175

(22) Filed: Apr. 22, 2014

(65) Prior Publication Data

US 2014/0225261 A1    Aug. 14, 2014

Related U.S. Application Data

(63) Continuation-in-part of application No. 13/550,951, filed on Jul. 17, 2012, now Pat. No. 8,735,278.

(51) Int. Cl.
*H01L 23/48* (2006.01)
*H01L 23/482* (2006.01)
(Continued)

(52) U.S. Cl.
CPC ...... *H01L 23/4827* (2013.01); *H01L 21/76807* (2013.01); *H01L 21/76834* (2013.01); *H01L 21/76843* (2013.01); *H01L 21/76852* (2013.01); *H01L 21/76867* (2013.01); *H01L 21/76885* (2013.01); *H01L 21/76897* (2013.01); *H01L 23/53233* (2013.01); *H01L 23/53238* (2013.01); *H01L 23/528* (2013.01); *H01L 2924/0002* (2013.01)

(58) Field of Classification Search
CPC ............... H01L 21/76807; H01L 21/76843
USPC ................... 257/774; 438/618, 622
See application file for complete search history.

(56) References Cited

U.S. PATENT DOCUMENTS 6,169,024 B1 * 1/2001 Hussein ............ H01L 21/76807
257/E21.579
7,166,922 B1 * 1/2007 Hussein ................ 257/758

(Continued)

OTHER PUBLICATIONS

Non-Final Office Action dated Apr. 11, 2013 for U.S. Appl. No. 13/550,951.

(Continued)

*Primary Examiner* — David Vu
*Assistant Examiner* — Brandon Fox
(74) *Attorney, Agent, or Firm* — Eschweiler & Associates, LLC

(57) ABSTRACT

Some embodiments of the present disclosure relate to an interconnect structure for connecting devices of a semiconductor substrate. The interconnect structure includes a dielectric layer over the substrate and a continuous conductive body passing through the dielectric layer. The continuous conductive body is made up of a lower body region and an upper body region. The lower body region has a first width defined between opposing lower sidewalls of the continuous conductive body, and the upper body region has a second width defined between opposing upper sidewalls of the continuous conductive body. The second width is less than the first width. A barrier layer separates the continuous conductive body from the dielectric layer.

18 Claims, 14 Drawing Sheets

(51) Int. Cl.
*H01L 21/768* (2006.01)
*H01L 23/532* (2006.01)
*H01L 23/528* (2006.01)

(56) References Cited

U.S. PATENT DOCUMENTS

| | | | |
|---|---|---|---|
| 7,378,349 B2 * | 5/2008 | Konno et al. | 438/693 |
| 7,538,434 B2 * | 5/2009 | Shih | H01L 23/53238 257/40 |
| 2002/0155693 A1 | 10/2002 | Hong et al. | |
| 2005/0218519 A1 | 10/2005 | Koike et al. | |
| 2012/0326313 A1 * | 12/2012 | Uzoh | H01L 23/5283 257/751 |

OTHER PUBLICATIONS

Final Office Action dated Oct. 7, 2013 for U.S. Appl. No. 13/550,951.
Notice of Allowance dated Jan. 17, 2014 for U.S. Appl. No. 13/550,951.

* cited by examiner

INTERCONNECT STRUCTURE INCLUDING A CONTINUOUS CONDUCTIVE BODY

REFERENCE TO RELATED APPLICATION

This application is a continuation-in-part application which claims priority to U.S. application Ser. No. 13/550,951 filed on Jul. 17, 2012 and entitled, "NOVEL COPPER ETCH SCHEME FOR COPPER INTERCONNECT STRUCTURE"; the contents of which are incorporated herewith in their entirety.

BACKGROUND

As the density of semiconductor devices increases and the size of circuit elements becomes smaller, the resistance capacitance (RC) delay time increasingly dominates the circuit performance. To reduce the RC delay, there is a desire to switch from conventional dielectrics to low-k dielectrics. These materials are particularly useful as intermetal dielectrics (IMDs), and as interlayer dielectrics (ILDs). However, low-k materials present problems during processing, especially during the processing of the conductive material used to make interconnects.

DETAILED DESCRIPTION

Figure 1A:
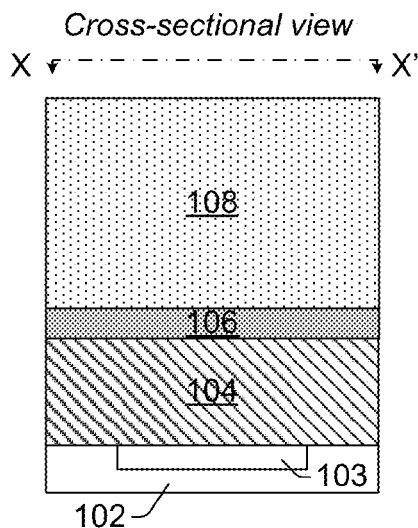
FIGS. 1A-1M are partial cross sectional views illustrating acts of some embodiments of forming an interconnect structure in accordance with the disclosure.
Figure 1A:
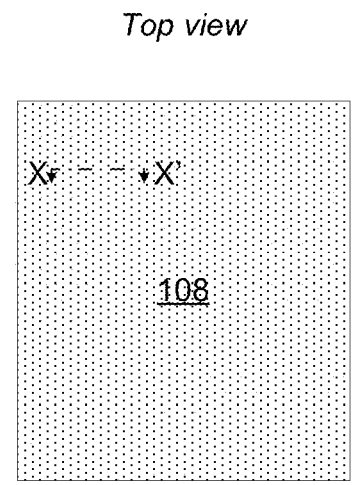

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Semiconductor devices are manufactured or fabricated on semiconductor wafers using a number of different processing acts to create transistor and interconnection elements. To electrically connect transistor terminals associated with the semiconductor wafer, conductive (e.g., metal) interconnect lines, vias, and the like are formed in dielectric materials as part of the semiconductor device. The interconnect lines and vias couple electrical signals and power between transistors, internal circuit of the semiconductor devices, and circuits external to the semiconductor device.

In forming the interconnection elements, the semiconductor wafer may undergo, for example, masking, etching, and deposition processes to form the desired electronic circuitry of the semiconductor devices. In particular, multiple masking and etching acts can be performed to form a pattern of recessed areas in a dielectric layer, such as a low-k dielectric layer, on a semiconductor wafer. These recessed areas serve as trenches and vias for the interconnections. A deposition process may then be performed to deposit a metal layer over the semiconductor wafer thereby depositing metal both in the trenches and vias and also on the non-recessed areas of the semiconductor wafer. To isolate the interconnections, such as patterned trenches and vias, the metal deposited on the non-recessed areas of the semiconductor wafer is removed.

The above masking, etching and deposition processes, however, often result in non-planar surface topologies. For example, the non-planar topology may include a hump and recess corresponding generally to the underlying densely spaced recessed regions and wide opening recessed regions respectively. Hump, recess, and other non-planar features may be caused, for example, by the plating chemistry in an electroplating process. Humps may degrade the performance of the formed devices. For example, a hump left above densely spaced interconnection lines or vias may cause an electrical short circuit between adjacent lines and recesses or may result in the reduction of the conductance of the formed interconnection lines.

Additionally, the low-k dielectric materials are susceptible to damage from the etching processes because they are softer, less chemically stable or more porous, or any combination of these factors. For example, plasma damage to low-k dielectric materials can result in higher leakage currents, lower breakdown voltages, and changes in the dielectric constant associated with the low-k dielectric material.

In various embodiments of the present disclosure, a manufacturing process is disclosed whereby damascene structures may be formed without encountering the various problems presented non-planar features and by porous low-K dielectric layers to improve integrated circuit device yield, performance, and reliability.

In some embodiments, the present disclosure is directed to methods of fabrication of an interconnect structure. The methods provide an etching process, such as a copper etching process for example, for defining an interconnect structure that eliminate non-planar features and dielectric damage caused during etching processes. The methods further allow conductive gap filling.

FIGS. 1A-1M illustrate a plurality of partial cross section diagrams illustrating some embodiments of a method of forming an interconnect structure at stages in the manufacturing process according to the disclosure. Each figure includes a top view on the right hand side, and a cross-sectional view on the left hand side which is taken along cut-away line X-X' in the corresponding top view.

Referring to FIG. 1A, a semiconductor substrate 102 having a conductive region 103 is provided. The conductive region 103 can correspond to a device region where an active or passive semiconductor device is formed in the substrate 102. For example, the semiconductor device can be a transistor, diode, capacitor, photo-detection element, micro-electrical mechanical system (MEMS) device, or some other semiconductor device. Thus, the conductive region 103 can correspond to an active region, a well region, a source/drain region, or an electrode in the substrate 102, or a conductive line which is buried in the substrate and which can be made of metal, polysilicon, doped semiconducting material, etc. The conductive region 103 can also correspond to a conductive feature formed on or over the semiconductor substrate 102. For example, conductive region 103 can correspond to a conductive electrode, such as a gate electrode, a capacitor electrode, etc., to a contact or via, to an interconnect line such as a line of conductive polysilicon, a line of metal (e.g., aluminum, tungsten, copper, nickel, gold, silver, or platinum, including alloys of these metals and/or other metals, among others), a metal0 line, metal1 line, metal2 line, and so on, or any other conductive feature. Substrate 102 is understood to include a semiconductor wafer or die, comprised of a semiconducting material such as silicon, germanium, a silicon on insulator structure (SOI), a binary semiconductor, such as GaAs, a ternary semiconductor, such as InGaAs, higher order semiconductor, etc. Semiconductor substrate 102 can further include one or more conductive layers (such as metal or silicon) and/or insulating layers, and one or more active or passive devices formed in or over the substrate or the like. Semiconductor substrate can also include multiple wafers or dies which are stacked or adhered together one on top of another (e.g., face-to-face) to facilitate efficiency in integration and packaging.

Overlying substrate 102 and covering conductive region 103 is a dielectric layer 104. In some embodiments, the dielectric layer 104 has a dielectric constant ($\kappa$) of less than about 4. Some examples of dielectrics used for dielectric layer 104 can include, for example, carbon-doped silicon dioxide, also referred to as organosilicate glass (OSG), carbon-oxide, etc. Low-k dielectric materials may also include borophosphosilicate glass (BPSG), borosilicate glass (BSG), phosphosilicate glass (PSG), and/or tetraethyl orthosilicate (TEOS), among others. The dielectric layer 104 may be formed using, for example, chemical vapor deposition (CVD), plasma enhanced CVD (PECVD), low pressure CVD (LPCVD), spin-on coating techniques, etc. In some embodiments, the dielectric layer 104 can be a low-k dielectric, an ultra-low-k dielectric, an extreme-low-k dielectric, such as dielectrics with high porosity and/or air-gaps, etc.

A first barrier layer 106 is formed overlying the dielectric layer 104. First barrier layer 106 is configured to prevent conductive layer 108 above barrier layer 106 from penetrating into the dielectric layer 104. First barrier layer 106 can be formed from a dielectric material such as, in some embodiments, a silicon carbide, silicon nitride, silicon oxycarbide, etc. The thickness of the barrier layer 106 can be from about 1 nm to about 10 nm in some embodiments.

A continuous conductive layer 108, such as copper or a copper alloy, is formed over barrier layer 106. Although not explicitly shown in FIG. 1A, the continuous conductive layer 108 is electrically coupled to the conductive region 103 in or on the substrate 102 by a conductive electrical path, which can include interconnect layers, vias, and/or contacts. In some embodiments where a copper alloy is used, an alloy component in the copper alloy comprises Mg, Al, Cr, Mn, and/or Ti, and the alloy component has a concentration ranging from about 0.5% to about 50% of the copper alloy by weight. In some embodiments, the conductive layer 108 can be formed by electroplating, sputtering, epitaxial growth techniques, or vapor deposition techniques, among others. Further, in some embodiments, the conductive layer 108 can be formed continuously in situ so that the conductive layer 108 is a continuous conductive body without any seams or native oxides residing therein. Although the conductive layer 108 is described in some embodiments as being copper or a copper alloy, other conductive layers can also be used, such as conductive polysilicon, aluminum, tungsten, nickel, gold, silver, platinum, including alloys and combinations of these metals, or other metals and/or combinations thereof, for example.

Figure 1B:
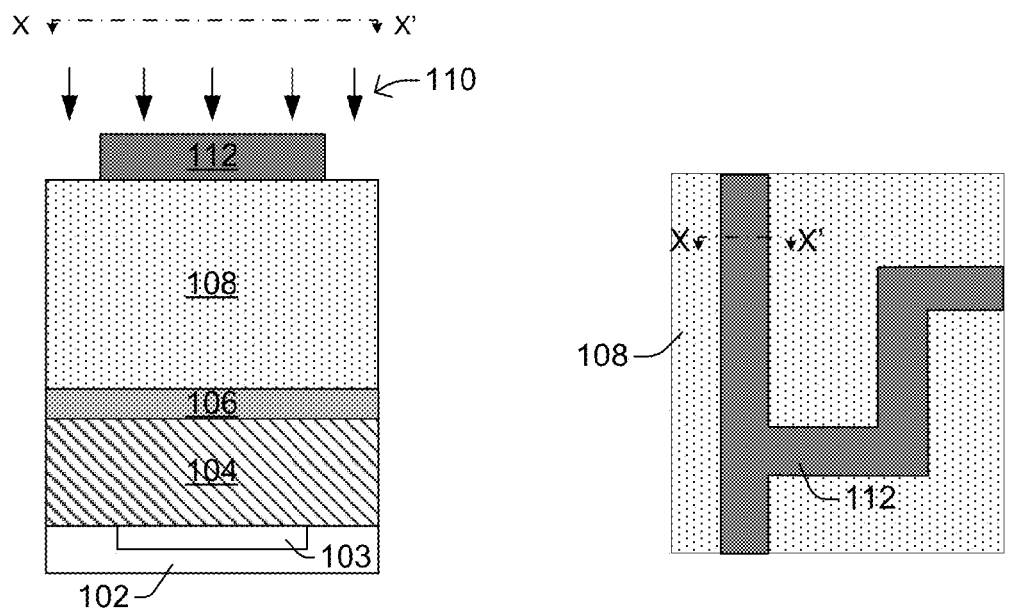
Figure 1B:
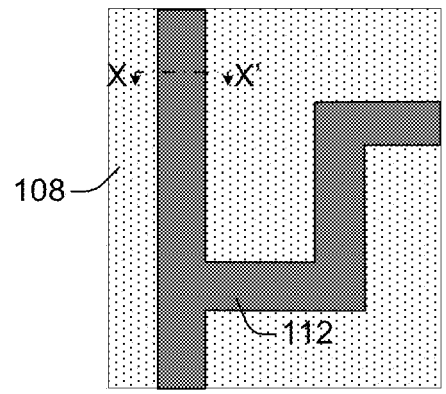

In FIG. 1B, a first mask 112 is formed by process 110 over the conductive layer 108. The first mask 112 can be a photoresist mask, or can also be another type of mask, such as a nitride hard mask or another hardmask. For example, if the first mask 112 is a photoresist mask, the photoresist mask can be a carbon-containing organic material and can have various thicknesses. The first mask 112 can be lithographically patterned, and may be referred to in some embodiments as an interconnect line mask. As can be appreciated in the right-hand portion of FIG. 1B, in some embodiments, the first mask 112 can correspond to a winding conductive pathway to be patterned, such as used for a metal0 line, metal1 line, metal2 line, and so on, or for another interconnect line layer.

Figure 1C:
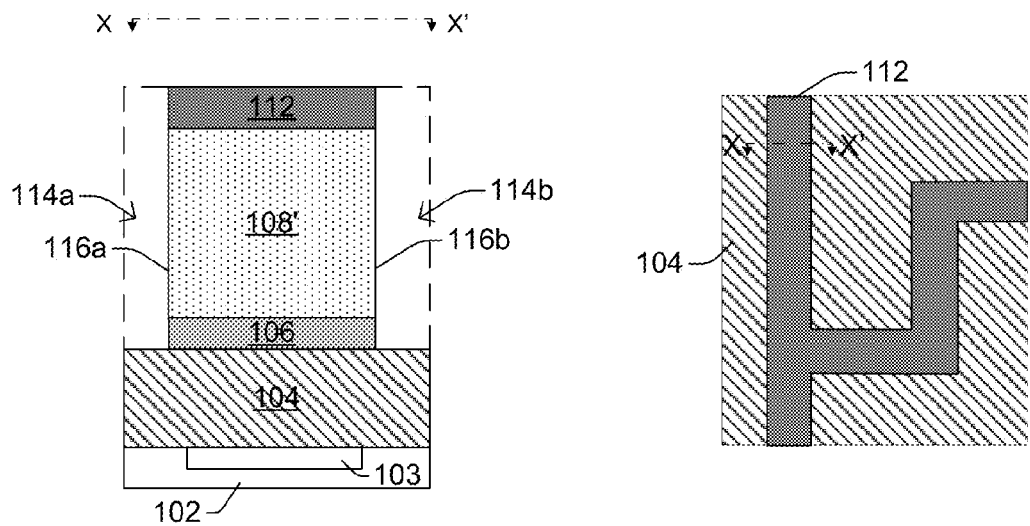

In FIG. 1C, with the first mask 112 in place, an etch is carried out to form first conductive layer recesses 114a, 114b on either side of the mask 112. These conductive layer recesses 114a, 114b define a continuous conductive body 108'. Continuous conductive body 108' includes opposing sidewalls 116a, 116b adjacent to first recesses 114a, 114b. Following formation of continuous conductive body 108', first mask 112 is removed by, in some embodiments, a plasma operation (not shown).

Figure 1D:
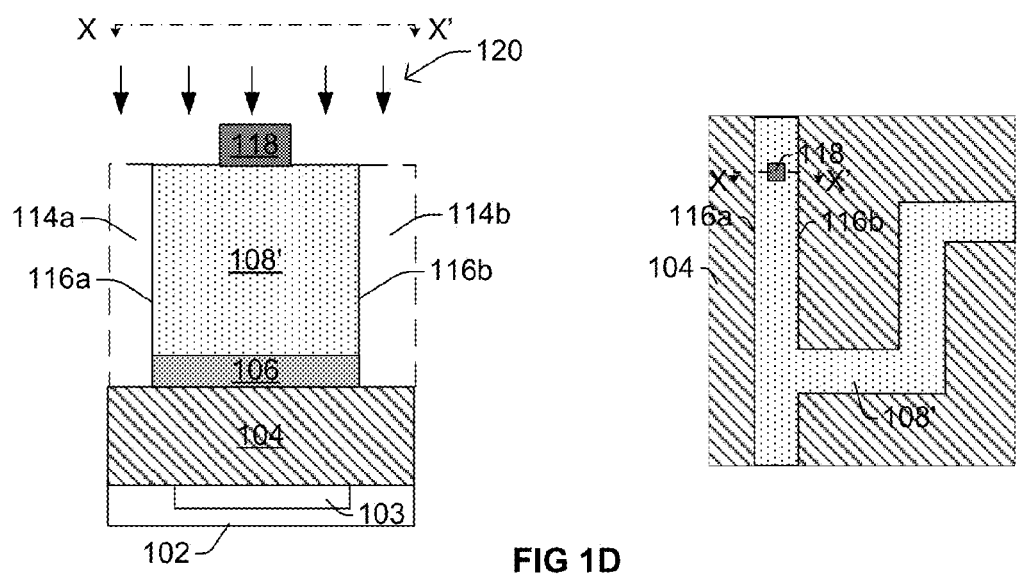

In FIG. 1D, a second mask 118 is formed by process 120 over continuous conductive body 108'. The second mask 118 can be a photoresist mask, or can also be another type of mask, such as a nitride hard mask or another hardmask, and may be referred to as a via mask in some embodiments. As shown in the right hand side of FIG. 1D, the second mask 118 can have a perimeter that falls entirely over the continuous conductive body 108'.

Figure 1E:
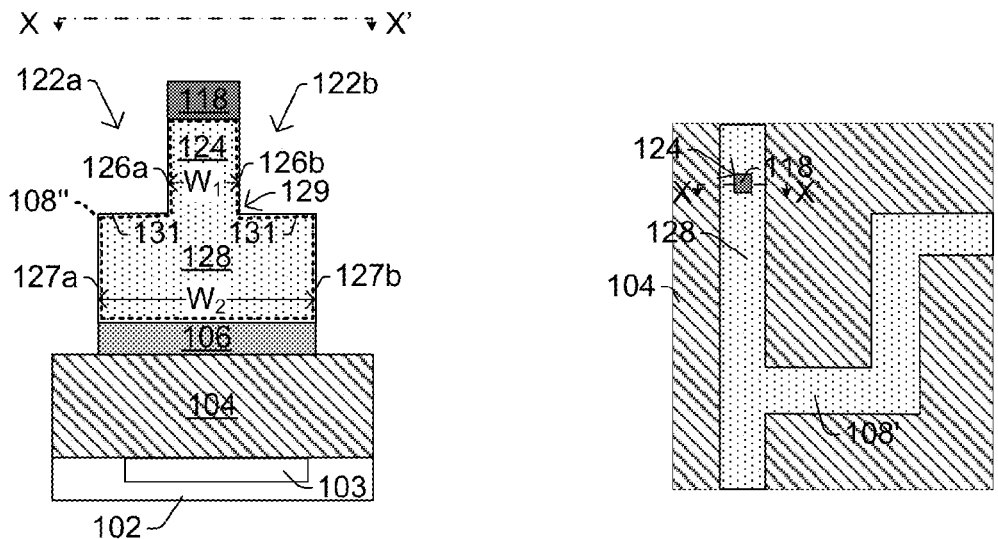

As shown in FIG. 1E, with the second mask 118 in place, an etching process removes exposed regions of the conductive body 108" not covered by mask 118. Thus, second recesses 122a, 122b are formed to define an upper body region 124 and a lower body region 128. As illustrated in the right-hand side of FIG. 1E, in some embodiments, upper body region 124 comprises a via region and lower body region 128 comprises an interconnect line region. The upper and lower body regions, 124, 128 of continuous conductive body 108", are therefore still continuous with one another. Thus, the upper and lower body regions 124, 128 are not separated by a native oxide, a seam, or another similar type structure that would likely be present if the upper and lower body regions were formed sequentially at different stages in the manufacturing process.

The upper body region 124 has a first width, $w_1$, as defined between opposing upper body sidewalls 126a, 126b; and the lower body region 128 has a second width, $w_2$, as defined between opposing lower body sidewalls 127a, 127b. In some embodiments, the second width is less than the first width, such that the upper and lower body regions meet at a shoulder 129. In some embodiments, shoulder 129 is evidenced by upper body sidewalls 126a, 126b that meet lower body upper surface 131 at an angle of approximately ninety degrees, thereby forming an inverted "T" shape. Thus, for example, the upper body sidewalls 126a, 126b can be substantially vertical and substantially planar, and the lower body upper surface 131 can be substantially horizontal and substantially planar. However, in other embodiments, the shoulder 129 can be rounded to some degree, wherein the extent of rounding depends upon the etch procedure used. Thus, in some embodiments, the upper body sidewalls 126a, 126b can be offset from vertical (e.g., "tilted") and/or can be non-planar, and the lower body upper surface 131 can be offset from horizontal (e.g., "sloping") and/or non-planar (e.g., indented or protruding). Thus, the angle between sidewalls 126a, 126b and lower body upper surface 131 can in fact be acute or obtuse in some embodiments. In some embodiments, the shoulder region 129 is located at a height, h, of approximately one-half of a total height, $h_{total}$, of the conductive body 108". Further, in some embodiments, $w_1$ and $w_2$ can be equal, in which case shoulder 129 would not exist.

Figure 1F:
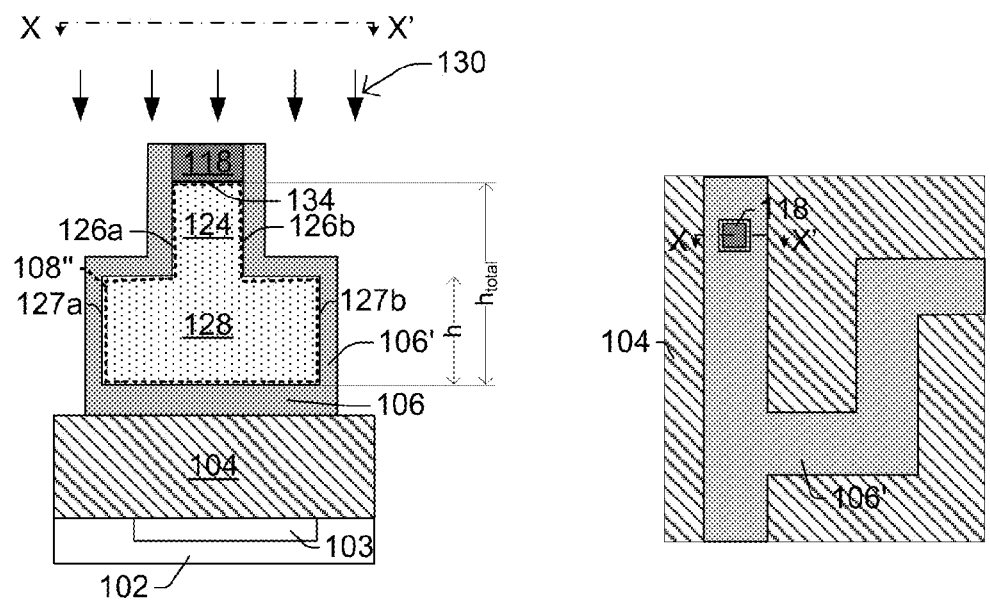

In FIG. 1F, barrier layer 106' is formed to encapsulate conductive body 108". The barrier layer 106' is formed about lower body sidewalls 127a and 127b and about upper body sidewalls 126a, 126b. In the illustrated embodiment, the barrier layer 106' is not formed directly over upper body upper surface 134, however, in other embodiments, the barrier layer 106' could also extend directly over upper body upper surface 134, such as over second mask 118.

Figure 1G:
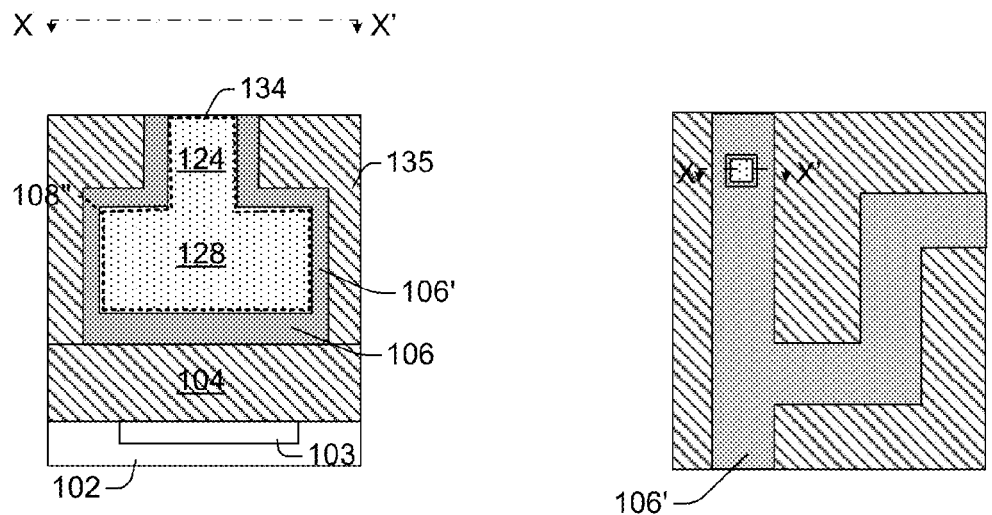

Following formation of barrier layer 106', a dielectric material 135 is deposited to fill first recesses 114a, 114b and second recessed 122a, 122b and to overlie the upper body upper surface 134. In FIG. 1G, a chemical mechanical polishing (CMP) process has been performed to planarize the structure and expose upper body upper surface 134.

Figure 1H:
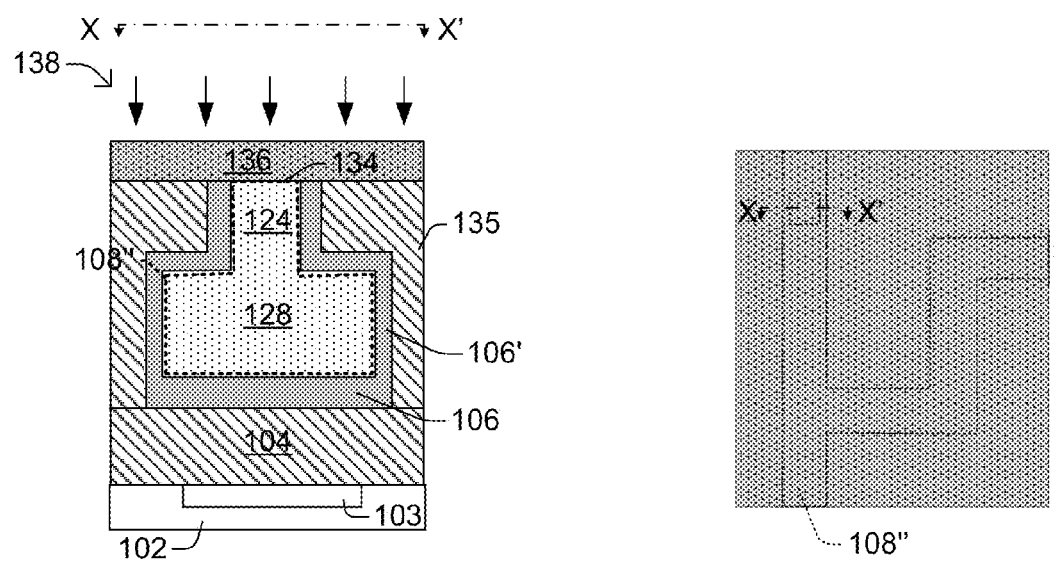

In FIG. 1H, a second barrier layer 136 is formed by process 138 over exposed upper surface 134. Second barrier layer 136 can be formed from a dielectric material, for example, silicon carbide or silicon oxynitride. The second barrier layer 136 can be deposited, in some embodiments, at a thickness of about 30 Angstroms or less. In some embodiments, the second barrier layer 136 can be formed from the same material as the first barrier layer 106. In other embodiments, second barrier layer 136 is formed from a material different from the first barrier layer 106. In some embodiments, the second barrier layer 136 can be conductive.

Figure 1I:
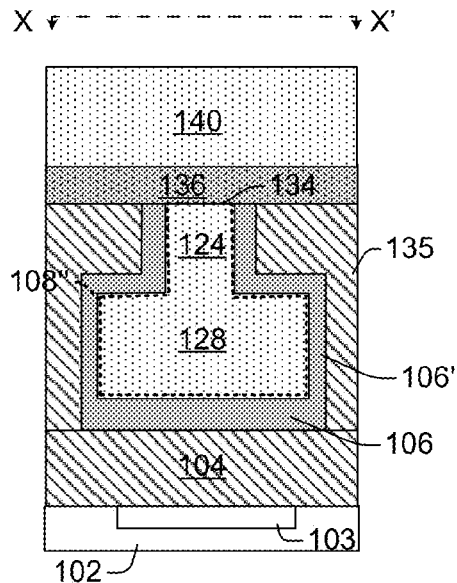
Figure 1I:
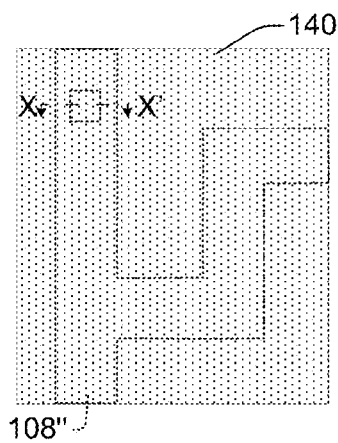

In FIG. 1I, following formation of the second barrier layer 136, an additional conductive layer 140, such as a copper or copper alloy layer for example, is formed over upper body region 124 of conductive body 108". This additional conductive layer 140 is electrically coupled to the conductive body 108" through the upper body region 124 and through the second barrier layer 136.

Figure 1J:
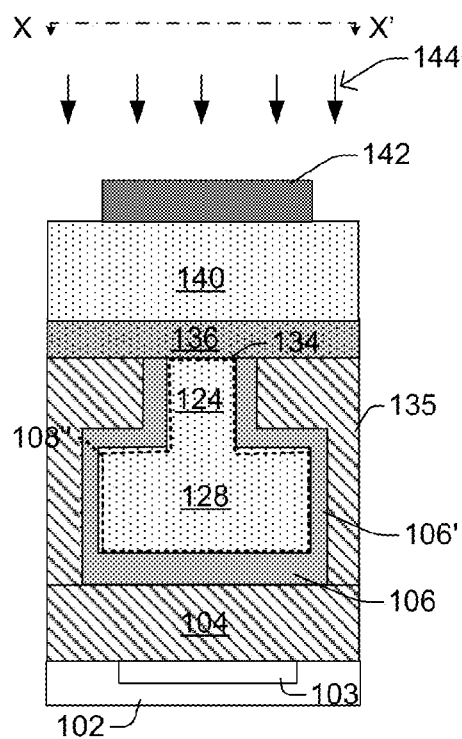
Figure 1J:
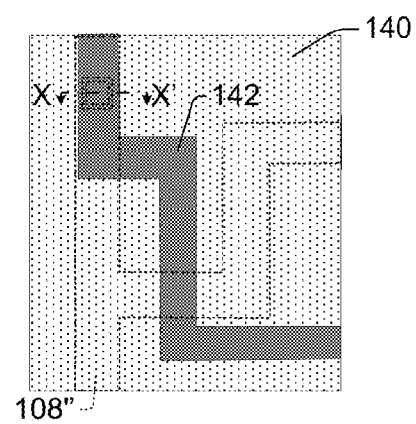

In FIG. 1J, a third mask 142 is then formed by process 144. For example, if the lower conductive body region 128 corresponds to a metal0 layer, the third mask 142 can correspond to a metal1 layer. Similarly, if the lower conductive body region 128 corresponds to a metal1 layer, the third mask 142 can correspond to a metal2 layer, and so on.

Figure 1K:
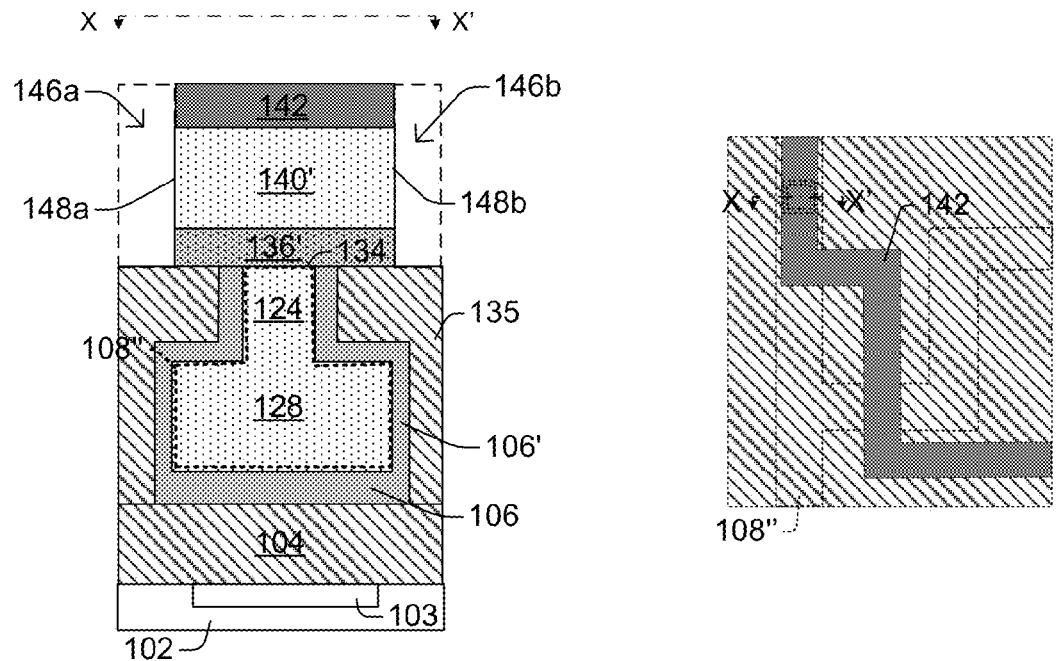

In FIG. 1K, an etch is performed with the third mask 142 in place to pattern and additional conductive body 140' which has additional conductive body sidewalls 148a, 148b proximate to recesses 146a, 146b. In some embodiments the additional conductive body 140' is copper or a copper alloy, however, the additional conductive body 140' could also comprise another conductive material such as a metal.

Figure 1L:
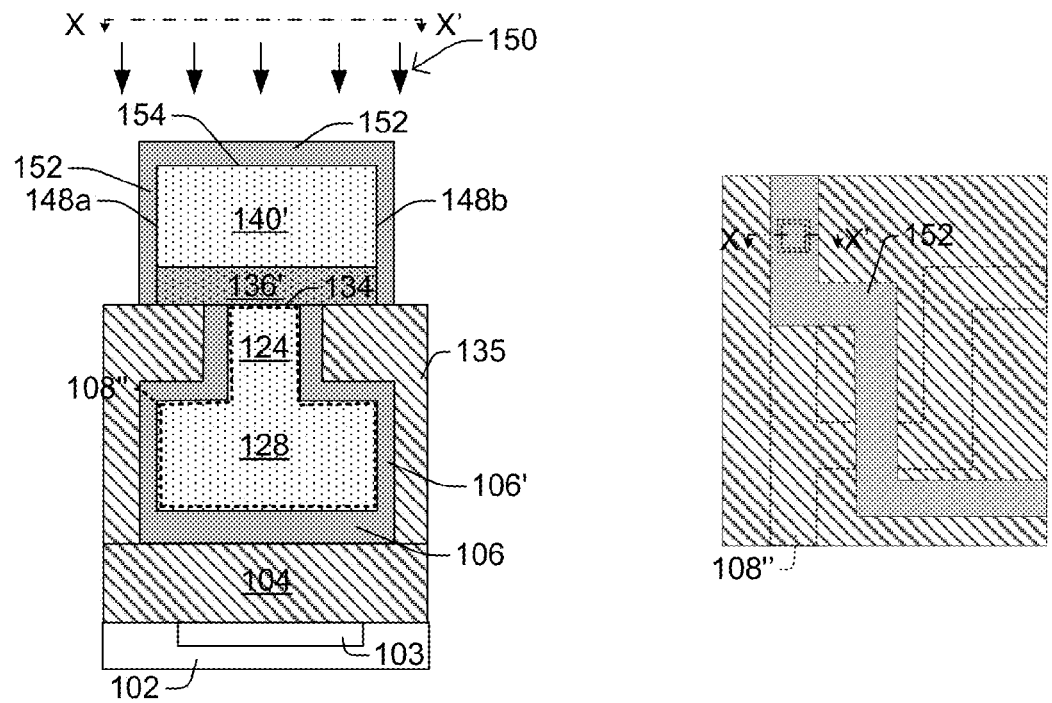

In FIG. 1L, the third mask 142 has been removed, after which barrier layer 152 is then formed by process 150. The barrier layer 152 encompasses additional conductive body 140', and extends along outer additional conductive body sidewalls 148a and 148b and over additional conductive body upper surface 154. Barrier layer 152 can be, in some embodiments, the same material as barrier layer 106. However, in other embodiments, barrier layer 152 can be made of a different material than barrier layer 106.

Figure 1M:
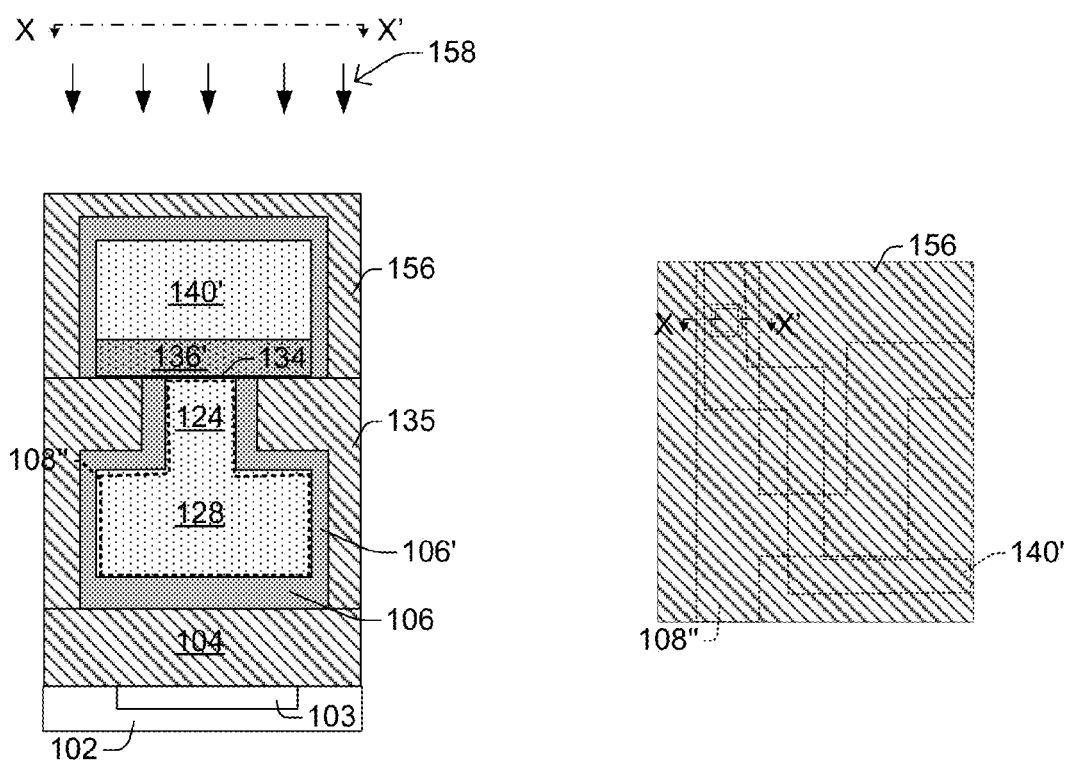

In FIG. 1M, following formation of barrier layer 152, a dielectric material 156 is formed by process 158 to fill recesses 146a and 146b adjacent to additional conductive body 140'. The dielectric material 156 is, in some embodiments, a low-k dielectric, but also can be another type of dielectric, such as an ultra-low-k dielectric or an extreme-low-k dielectric, for example.

Another manufacturing flow with reference to FIGS. 2A-2L is now described below, in accordance with some embodiments. This manufacturing flow starts at FIG. 2A, where a conductive region 203 is provided in or on semiconductor substrate 202. A dielectric layer 204 overlies the conductive region 203, and a continuous conductive layer 208 directly overlies the dielectric layer. The substrate 202, conductive region 203, dielectric layer 204 and continuous conductive layer 208 correspond to those structures previously described in FIG. 1A, and therefore for purposes of conciseness, a description of these layers is not reproduced here. The same is true for subsequent acts in this manufacturing flow.

Figure 2A:
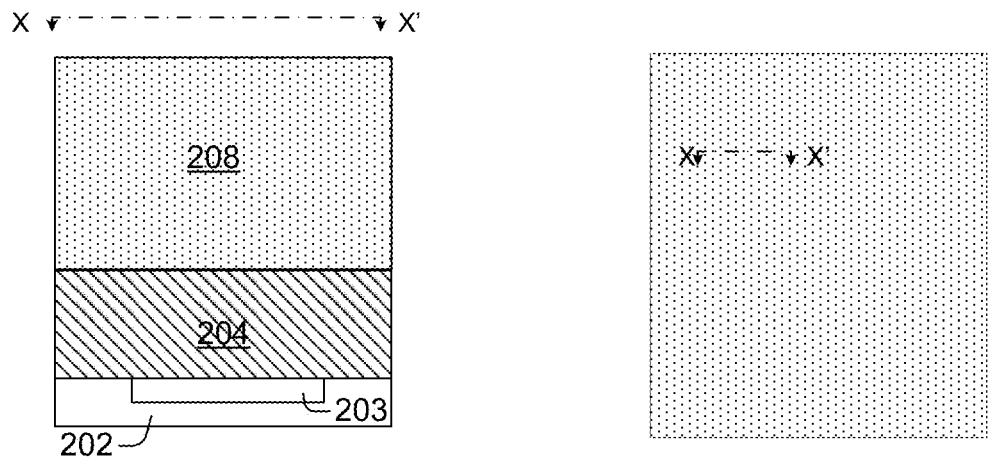
FIGS. 2A-2L are partial cross sectional views illustrating acts of a further embodiment of forming an interconnect structure in accordance with the disclosure.
Figure 2B:
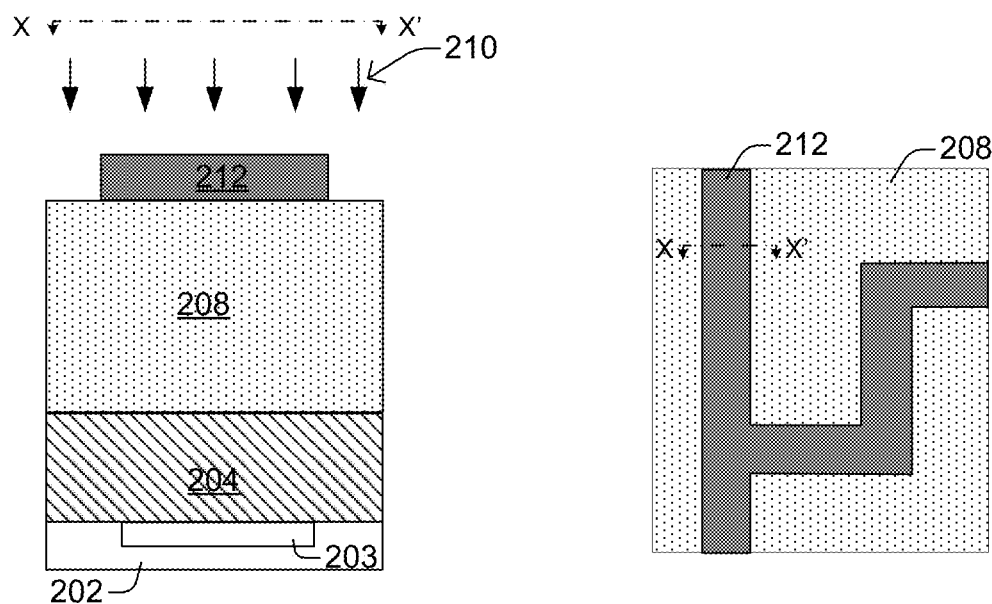

In FIG. 2B, a first mask 212 is formed by process 210 over the continuous conductive layer 208. As can be appreciated in the right-hand portion of FIG. 2B, in some embodiments, this first mask 212 corresponds to a winding conductive pathway to be patterned, such as used for a metal0 line, metal1 line, metal2 line, and so on, or for another interconnect line layer.

Figure 2C:
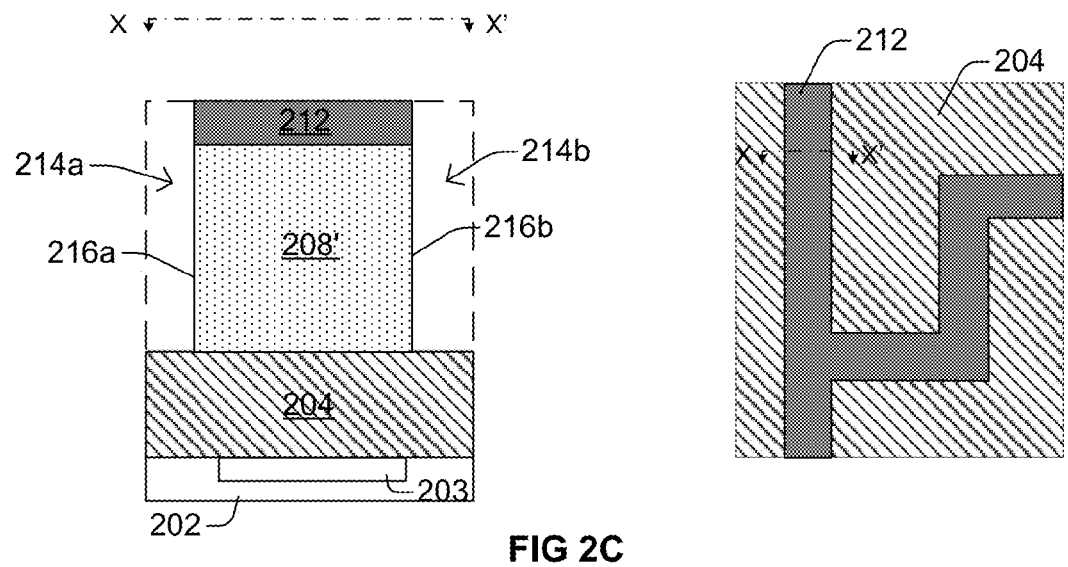

In FIG. 2C, with the mask 212 in place, an etch is carried out to form first conductive layer recesses 214a, 214b on either side of the mask 212, thereby forming a continuous conductive body 208'. Continuous conductive body 208' includes opposing sidewalls 216a, 216b which are defined by first recesses 214a, 214b.

Figure 2D:
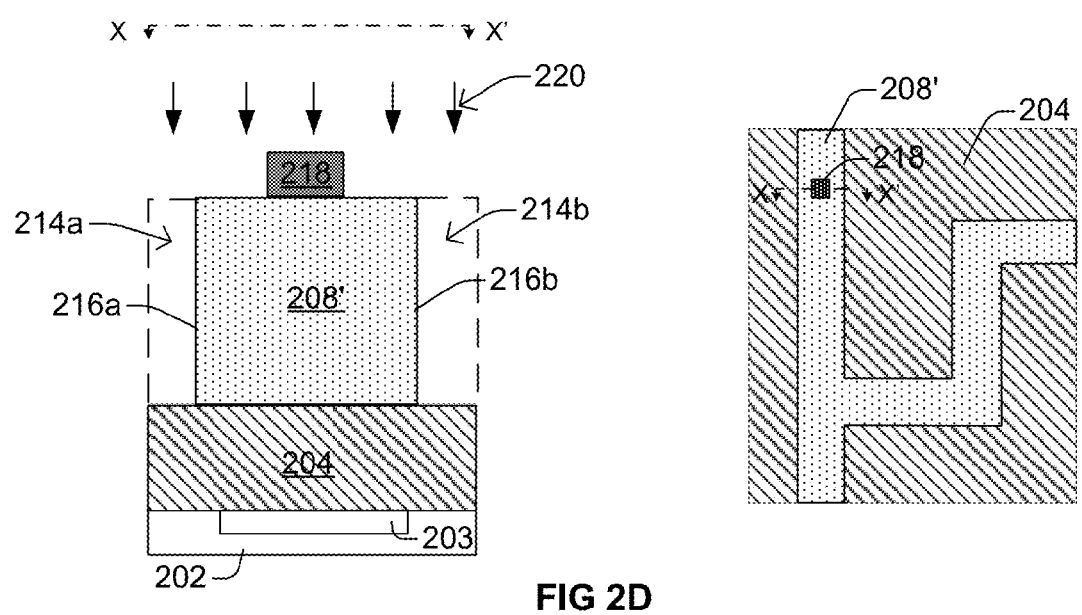

In FIG. 2D, a second mask 218 is formed by process 220 over conductive body 208'.

Figure 2E:
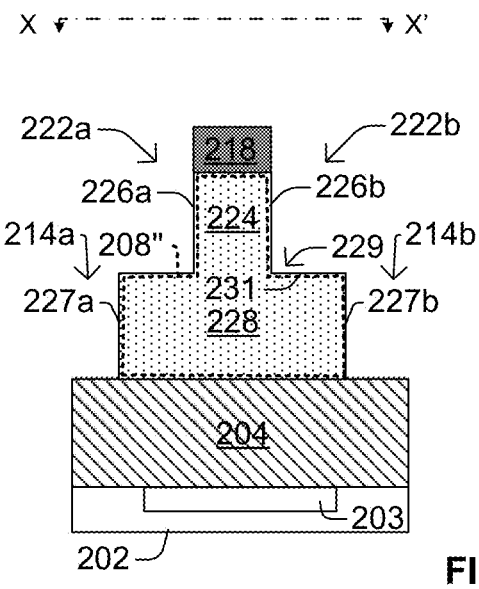
Figure 2E:
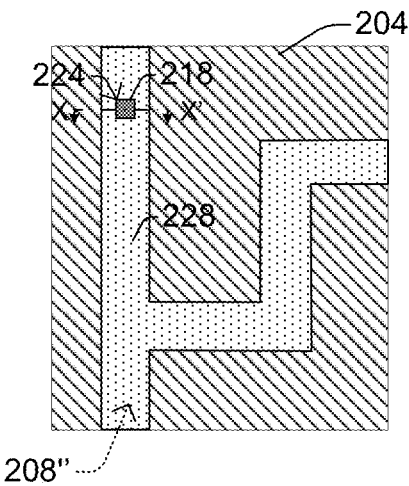

In FIG. 2E, with the second mask 218 in place, an etching technique is applied to remove exposed regions of the conductive body 208' not covered by mask 218. Thus, second recesses 222a, 222b are formed to define an upper body region 224 and a lower body region 228 within conductive body 208". As illustrated in the right-hand side of FIG. 2E, in some embodiments, upper body region 224 comprises a via region, and lower body region 228 comprises an interconnect line region. The upper and lower body regions, 224, 228, which are formed from continuous conductive body 208", are therefore still continuous with one another. Thus, the upper and lower body regions 224, 228 are not separated by a native oxide, a seam, or another similar type structure that would likely be present if the upper and lower body regions were formed sequentially at different stages in the manufacturing process.

The upper body region 224 has a first width, $w_1$, as defined between opposing upper body sidewalls 226a, 226b; and the lower body region 228 has a second width, $w_2$, as defined between opposing lower body sidewalls 227a, 227b. The second width is less than the first width, such that the upper and lower body regions meet at a shoulder 229. In some embodiments, this shoulder 229 is evidenced by upper body sidewalls 226a, 226b that meet lower body upper surface 231 at an angle of approximately ninety degrees. Thus, for example, the upper body sidewalls 226a, 226b can be substantially vertical and substantially planar, and the lower body upper surface 231 can be substantially horizontal and substantially planar. However, in other embodiments, the shoulder 229 can be rounded to some degree, wherein the extent of rounding depends upon the etch procedure used. Thus, in some embodiments, the upper body sidewalls 226a, 226b can be offset from vertical (e.g., "tilted") and/or can be non-planar, and the lower body upper surface 231 can be offset from horizontal (e.g., "sloping") and/or non-planar (e.g., indented or protruding).

Figure 2F:
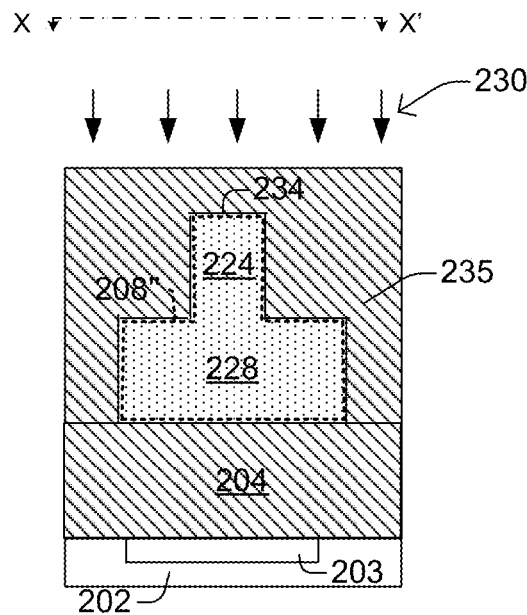
Figure 2F:
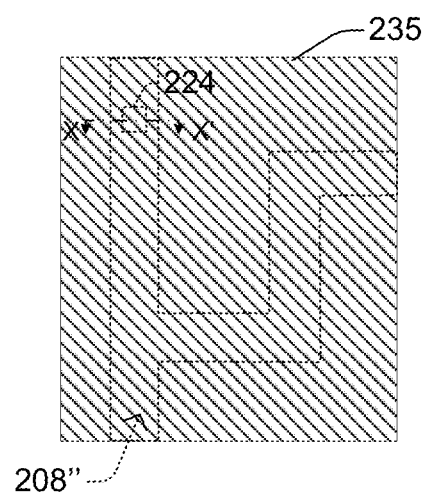

In FIG. 2F, the mask 218 has been removed, and a dielectric material 235 is provided by process 230. The dielectric material 235 fills first recesses 214a, 214b and second recessed 222a, 222b, and overlies the upper body upper surface 234.

Figure 2G:
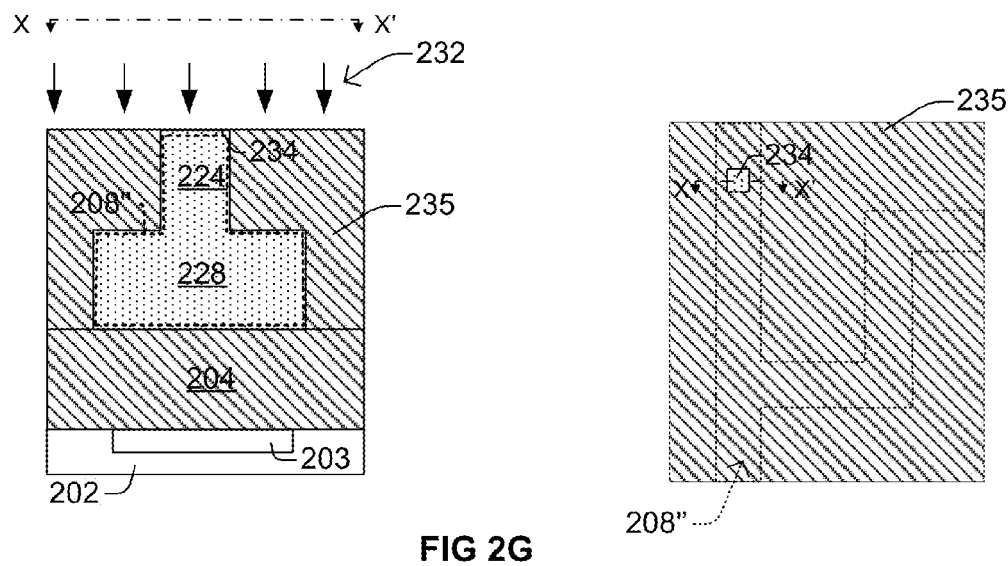

In FIG. 2G, a chemical mechanical polishing (CMP) process 232 has been performed to planarize the structure and expose upper body upper surface 234.

Figure 2H:
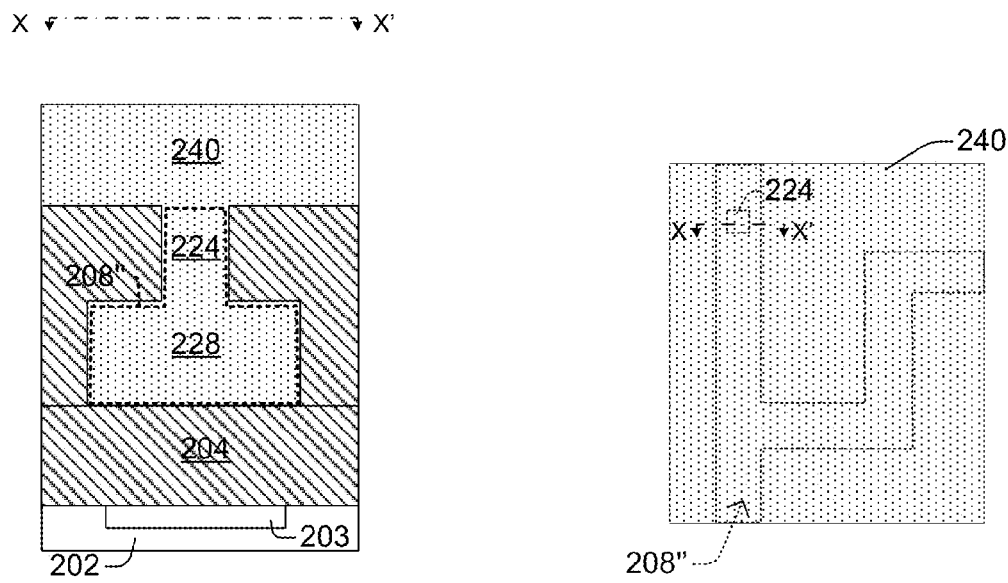

In FIG. 2H, an additional conductive layer 240, such as a copper or copper alloy layer for example, is formed over upper body region 224 of conductive body 208". This additional conductive layer 240 is electrically coupled to the conductive body 208" through the upper body region 224. In this embodiment, a lower surface of the additional conductive layer 240 directly abuts the upper body upper surface 234.

Figure 2I:
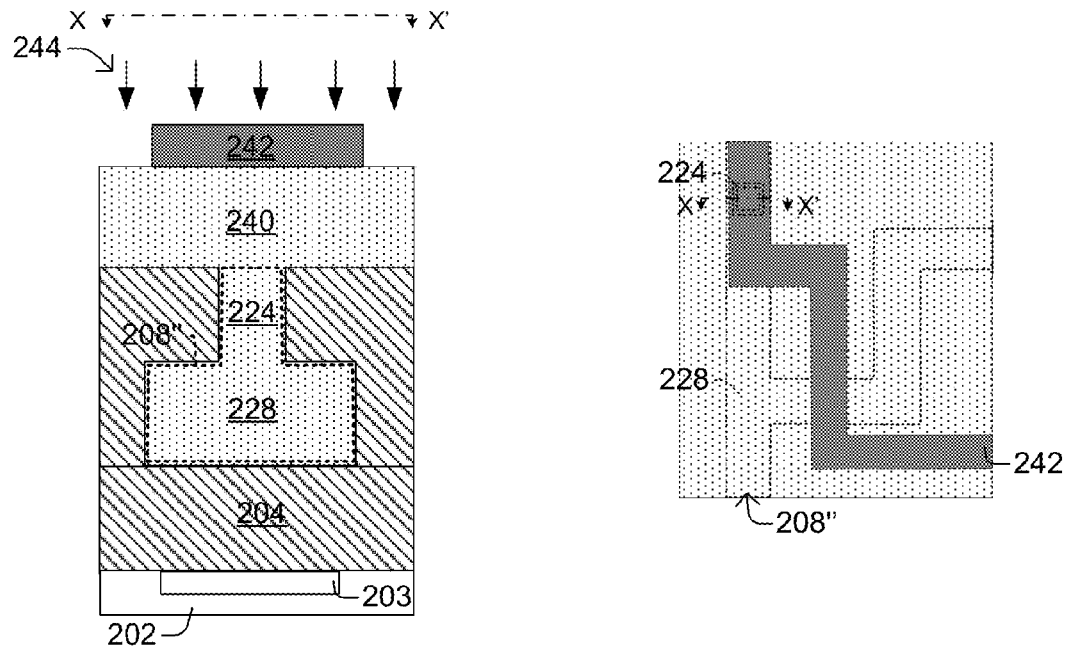

In FIG. 2I, a third mask 242 is then formed by process 244. This third mask 242 can correspond to a second conductive interconnect layer. For example, if the lower conductive body 228 corresponds to a metal0 layer, the third mask 242 can correspond to a metal1 layer. Similarly, if the lower conductive body 228 corresponds to a metal1 layer, the third mask can correspond to a metal2 layer, and so on.

Figure 2J:
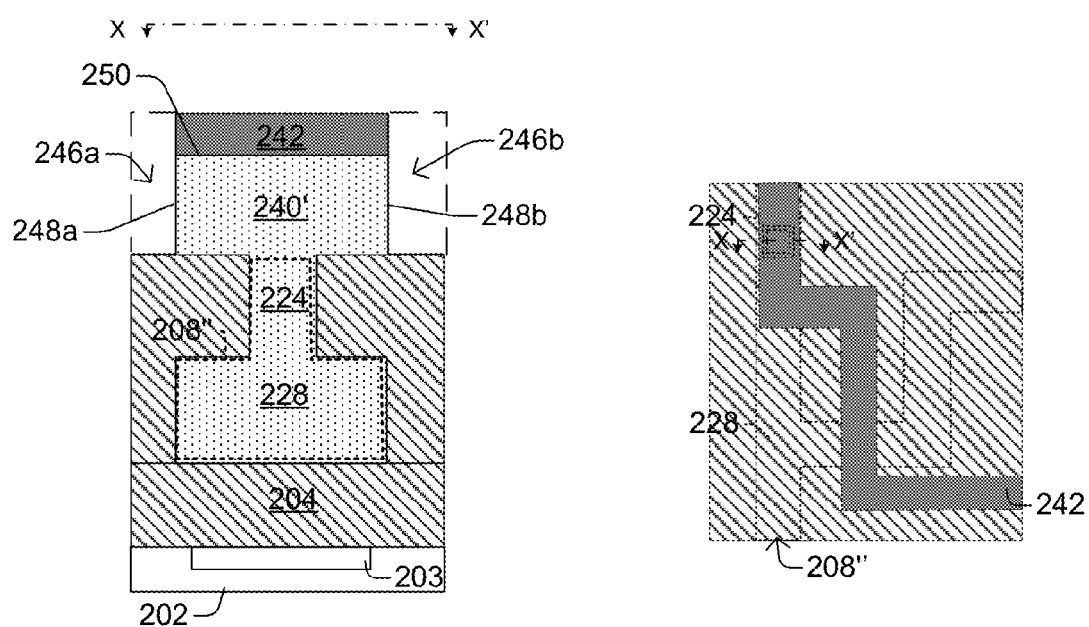

In FIG. 2J, an etch is performed with the third mask 242 in place to form an additional conductive body 240' having additional conductive layer sidewalls 248a, 248b proximate to recesses 246a, 246b. In some embodiments, the additional conductive body 240' is copper or a copper alloy, however, the additional conductive body 240' could also comprise another conductive material such as a metal.

Figure 2K:
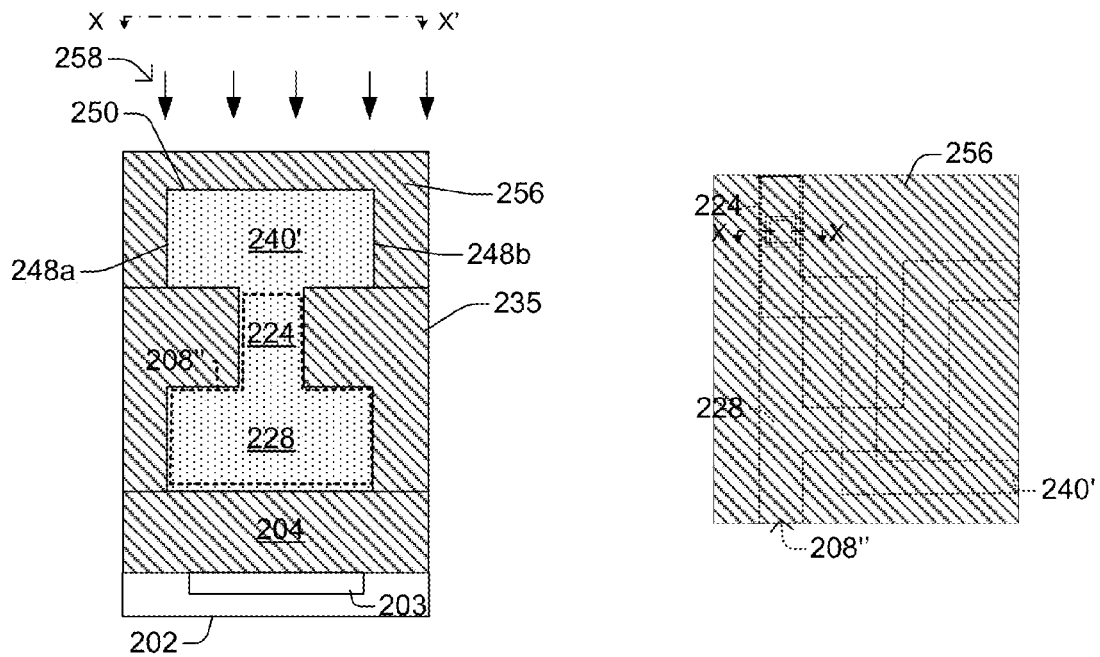

In FIG. 2K, the third mask 242 has been removed, and a dielectric material 256 is formed by process 258 to fill recesses 246a and 246b adjacent to additional conductive body 240'. The dielectric material 256 is often a low-k dielectric, but also can be another type of dielectric, such as an ultra-low-k dielectric or an extreme-low-k dielectric, for example.

Figure 2L:
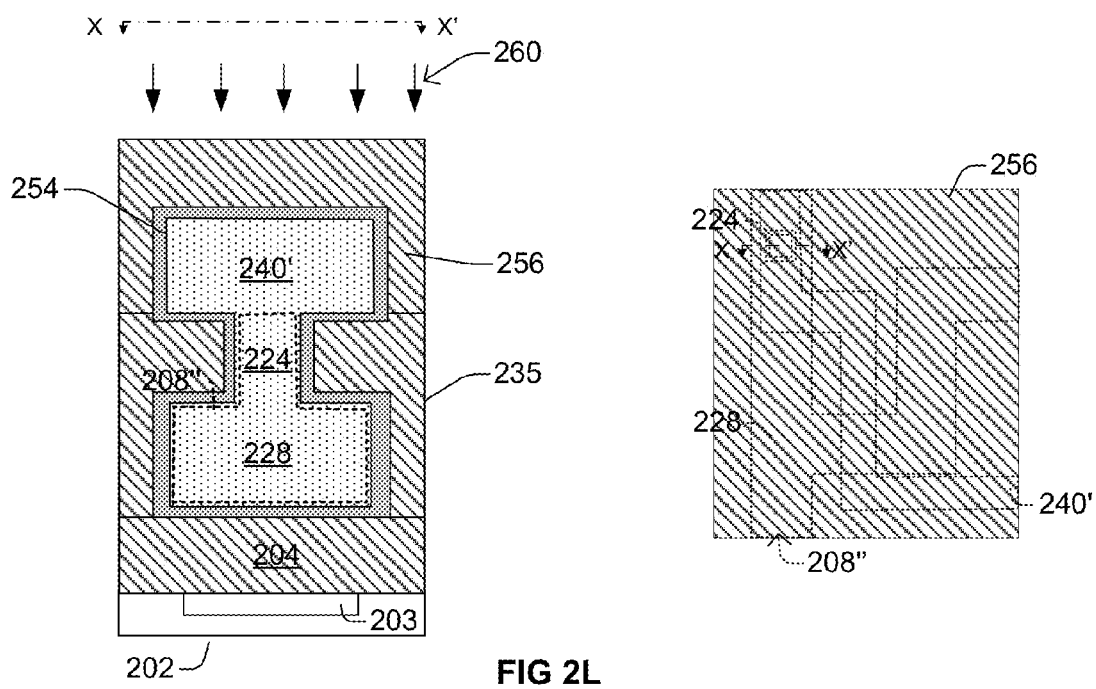

In FIG. 2L, a high temperature process 260, such as an anneal is performed to form a barrier layer 254 that encapsulates the continuous conductive body 208", which includes the lower body region 228 and upper body region 224, with the additional conductive body 240'. For example, in some embodiments, the anneal can be carried out at a temperature that is lower than 400° C., for example between 50° C. and 400° C. In some embodiments, the anneal can segregate alloy components such as Mg, Al, Cr, Mn, or Ti, for example, from Cu in the conductive body 208", thereby causing the barrier layer 254 to have a higher concentration of the alloy components than surrounding regions of the conductive body 208" and additional conductive body 240'. In this way, the barrier layer 254 separates the dielectric material 204, 235, and 256 from both the conductive body 208" and the additional conductive body 240'. The barrier layer 254 extends continuously along sidewalls of the upper body region 224, along sidewalls of the lower body region 228, and along sidewalls of the additional conductive body 240, and further extends continuously under a lower surface of the conductive body 228 and over an upper surface of the additional conductive body 240' to separate the dielectric material 256, 235, 204 from both the conductive body 208" and the additional conductive body 240'.

Figure 3:
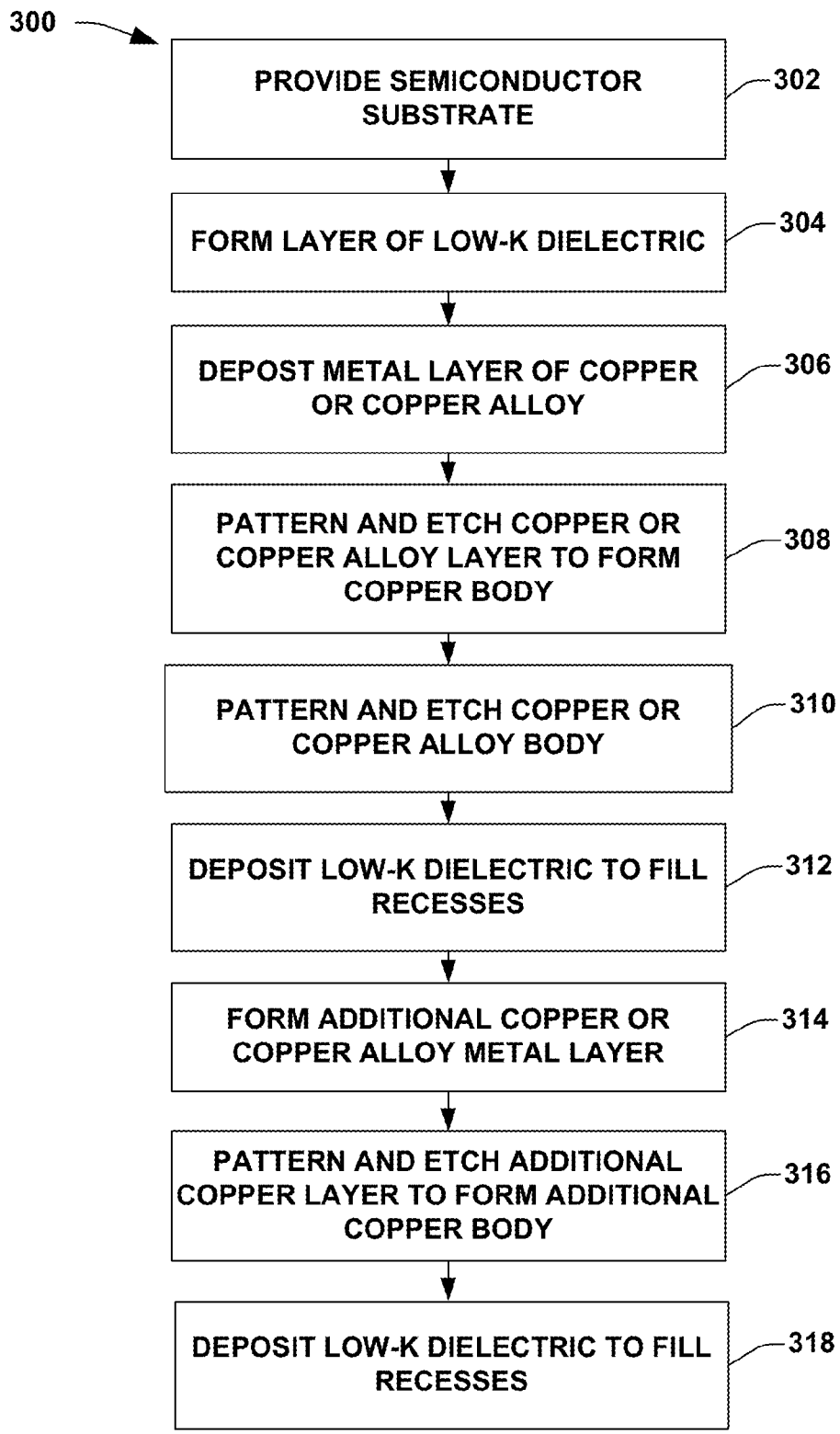
FIG. 3 illustrates a flow diagram of some embodiments of a method for the fabrication of a semiconductor structure in accordance with the disclosure.

FIG. 3 illustrates a flow diagram of some embodiments of a method 300 for formation of a semiconductor structure according to an embodiment of the disclosure. While method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 302 a semiconductor substrate is provided. A low-k dielectric layer is then formed over the substrate at act 304.

At act 306, a metal layer of copper or copper alloys is deposited overlying the low-k dielectric layer.

At act 308, the copper or copper alloy layer is patterned and etched to form a copper body having first recesses about opposing sidewalls.

At act 310, the copper or copper alloy body is patterned and etched to form second recesses.

At act 312, low-k dielectric material is deposited to fill first and second recesses.

At act 314, an additional copper or copper alloy layer is formed overlying dielectric material.

At act 316, the additional copper or copper alloy layer is patterned and etched to form an additional copper body having additional recesses.

At act 318, a low-k dielectric material is deposited to fill additional recesses. The method then ends.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, some embodiments of the present disclosure relate to an interconnect structure for connecting devices of a semiconductor substrate. The interconnect structure includes a dielectric layer over the substrate and a continuous conductive body passing through the dielectric layer. The continuous conductive body is made up of a lower body region and an upper body region. The lower body region has a first width defined between opposing lower sidewalls of the continuous conductive body, and the upper body region has a second width defined between opposing upper sidewalls of the continuous conductive body. The second width is less than the first width. A barrier layer separates the continuous conductive body from the dielectric layer.

Other embodiments of this disclosure relate to an interconnect structure for connecting devices of a semiconductor substrate. The interconnect structure includes a dielectric layer arranged over the semiconductor substrate. A conductive body passes through the dielectric layer and is made up of a lower body region that is continuous with an upper body region. The lower body region has a first width and the upper body region has a second width. The second width is less than the first width. A barrier layer separates the dielectric layer from the conductive body. An additional conductive body is arranged over the conductive body and is electrically coupled to the upper body region.

Still other embodiments relate to an interconnect structure for connecting devices of a semiconductor substrate. The interconnect structure includes a dielectric layer arranged over the semiconductor substrate, and a conductive body passing through the dielectric layer. The conductive body is made up of a lower body region that is continuous with an upper body region. The lower body region has a first width and the upper body region has a second width, wherein the second width is less than the first width. An upper surface of the lower body region meets a sidewall of the upper body region at a shoulder region.

What is claimed is:

1. An interconnect structure for connecting devices of a semiconductor substrate, comprising:
   a dielectric layer over the substrate;
   a continuous conductive body passing through the dielectric layer and made up of a lower body region and an upper body region, wherein the lower body region is an interconnect line region and the upper body region is a via region which is continuous with the interconnect line region, wherein the lower body region has a first width defined between opposing lower sidewalls of the continuous conductive body, and wherein the upper body region has a second width defined between opposing upper sidewalls of the continuous conductive body, wherein the second width is less than the first width; and
   a barrier layer separating the continuous conductive body from the dielectric layer, wherein the barrier layer comprises:
      a first barrier layer extending along sidewalls of the via region and along sidewalls of the interconnect line region and extending under a lower surface of the interconnect line region to separate the conductive body from the dielectric layer; and
      a second barrier layer overlying an upper surface of the via region, wherein the first barrier layer and second barrier layer are continuous.

2. The interconnect structure of claim 1, wherein the continuous conductive body is made of copper or a copper alloy.

3. The interconnect structure of claim 2, wherein an alloy component in the copper alloy comprises Mg, Al, Cr, Mn, or Ti.

4. The interconnect structure of claim 3, wherein the alloy component has a concentration ranging from about 0.5% to about 50% of the copper alloy by weight.

5. The interconnect structure of claim 1 wherein the dielectric layer has a dielectric constant of less than 4.

6. An interconnect structure for connecting devices of a semiconductor substrate, comprising:
   a dielectric layer over the substrate;
   a continuous conductive body passing through the dielectric layer and made up of a lower body region and an upper body region, wherein the lower body region is an interconnect line region and the upper body region is a via region which is continuous with the interconnect line region, wherein the lower body region has a first width defined between opposing lower sidewalls of the continuous conductive body, and wherein the upper body region has a second width defined between opposing upper sidewalls of the continuous conductive body, wherein the second width is less than the first width;
   a barrier layer separating the continuous conductive body from the dielectric layer; and
   an additional conductive body abutting an upper surface of the via region and electrically coupled to the via region;
   wherein the barrier layer extends continuously along sidewalls of the via region, along sidewalls of the interconnect line region, and along sidewalls of the additional conductive body, and further extends continuously under a lower surface of the conductive body and over an upper surface of the additional conductive body to separate the dielectric layer from both the conductive body and the additional conductive body.

7. The interconnect structure of claim 6, wherein the barrier layer encapsulates the continuous conductive body with the additional conductive body to separate the dielectric layer from both the conductive body and the additional conductive body.

8. The interconnect structure of claim 1, further comprising:
   an additional conductive body overlying the via region and electrically coupled to the via region through the second barrier layer.

9. The interconnect structure of claim 1, wherein the first and second barrier layers comprise different materials.

10. The interconnect structure of claim 1, wherein the first barrier layer is a dielectric barrier and the second barrier layer is a conductive barrier.

11. The interconnect structure of claim 1, wherein the first and second barrier layers comprise the same material.

12. An interconnect structure, comprising:
   a dielectric layer arranged over a semiconductor substrate;
   a continuous conductive body passing through the dielectric layer and made up of a lower body region that is continuous with an upper body region, wherein the lower body region has a first width and the upper body region has a second width, wherein the second width is less than the first width;
   a barrier layer separating the dielectric layer from the continuous conductive body; and
   an additional conductive body arranged over the continuous conductive body and electrically coupled to the upper body region;
   wherein the lower body region and upper body region meet at a shoulder region which is located at a height of approximately one-half of a total height of the continuous conductive body.

13. An interconnect structure for connecting devices of a semiconductor substrate, comprising:
   a dielectric region disposed over the substrate;
   a lower interconnect line, which has a first width, extending through the dielectric region;
   a via, which has a second width that is less than the first width, extending through the dielectric region and meeting an upper surface region of the lower interconnect line to form a continuous conductive body therewith;
   an upper interconnect line extending through the dielectric region over the lower interconnect line and electrically coupled to the lower interconnect line through the via; and
   a first barrier layer disposed along a bottom surface and sidewalls of the lower interconnect line, along sidewalls of the via, and along a top surface and sidewalls of the upper interconnect line, the first barrier layer separating the continuous conductive body and the upper interconnect line from the dielectric region.

14. The interconnect structure of claim 13, further comprising:
   a second barrier layer disposed on a bottom surface of the upper interconnect line, wherein the second barrier layer separates the upper interconnect line from the dielectric region and the via.

15. The interconnect structure of claim 14, wherein the second barrier layer is made of a dielectric material having a thickness of less than about 30 Å.

16. The interconnect structure of claim 13, wherein the first barrier layer is made of silicon carbide, silicon nitride, or silicon oxycarbide.

17. The interconnect structure of claim 13, wherein the first barrier layer extends along an upper surface of the lower interconnect line which is not covered by the via and along a bottom surface of the upper interconnect line.

18. The interconnect structure of claim 17, wherein the first barrier layer is made of copper alloy and includes one or more elements selected from a group of Mg, Al, Cr, Mn and Ti.

* * * * *